United States Patent
Lin et al.

(10) Patent No.: US 10,110,167 B2
(45) Date of Patent: Oct. 23, 2018

(54) DOWN-CONVERSION MIXER

(71) Applicant: National Chi Nan University, Puli, Nantou (TW)

(72) Inventors: Yo-Sheng Lin, Nantou (TW); Hou-Ju Pan, Nantou (TW); Shao-Chun Liao, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 45 days.

(21) Appl. No.: 15/360,333

(22) Filed: Nov. 23, 2016

(65) Prior Publication Data

US 2017/0207749 A1    Jul. 20, 2017

(30) Foreign Application Priority Data

Jan. 19, 2016   (TW) .............................. 105101512 A

(51) Int. Cl.
  *G06G 7/16*   (2006.01)
  *H03D 7/14*   (2006.01)

(52) U.S. Cl.
  CPC ......... *H03D 7/1441* (2013.01); *H03D 7/1458* (2013.01); *H03D 7/1483* (2013.01); *H03D 2200/0023* (2013.01)

(58) Field of Classification Search
  None
  See application file for complete search history.

(56) References Cited

U.S. PATENT DOCUMENTS

| | | | |
|---|---|---|---|
| 8,829,974 B2 * | 9/2014 | Tsai ..................... | H03D 7/1441 327/355 |
| 9,843,290 B2 * | 12/2017 | Lin ....................... | H03D 7/1458 |
| 2014/0197874 A1 * | 7/2014 | Tsai ..................... | H03D 7/1441 327/359 |

* cited by examiner

*Primary Examiner* — Long Nguyen
(74) *Attorney, Agent, or Firm* — Merchant & Gould P.C.

(57) ABSTRACT

A down-conversion mixer includes a transconductance unit, a resonant unit and a mixing unit. The transconductance unit converts a differential input voltage signal pair into a differential input current signal pair. The resonant unit provides a negative resistance and a differential auxiliary current signal pair. The mixing unit mixes a combination of the differential input current signal pair and the differential auxiliary current signal pair with a differential oscillatory voltage signal pair to generate a differential mixed voltage signal pair.

10 Claims, 6 Drawing Sheets

DOWN-CONVERSION MIXER

CROSS-REFERENCE TO RELATED APPLICATION

This application claims priority of Taiwanese Patent Application No. 105101512, filed on Jan. 19, 2016.

FIELD

The disclosure relates to a mixer, and more particularly to a down-conversion mixer.

BACKGROUND

A conventional down-conversion mixer proposed in an article by Ning Zhang et al., entitled "W-Band Active Down-Conversion Mixer in Bulk CMOS," in IEEE Microwave and Wireless Components Letters, vol. 19, no. 2, pp. 98-100, February 2009, operates in a 76 GHz-77 GHz frequency band, and has a conversion gain of −8 dB and a noise figure of 17.8 dB.

Another conventional down-conversion mixer proposed in an article by Yo-Sheng Lin et al., entitled "A W-Band Down-Conversion Mixer in 90 nm CMOS with Excellent Matching and Port-to-Port Isolation for Automotive Radars," in 2014 11$^{th}$ International Symposium on Wireless Communications Systems, pp. 54-58, August 2014, operates in a 75 GHz-85 GHz frequency band, and has a conversion gain of 1.5 dB and a noise figure of 23.3 dB.

Measurement results of the above-mentioned conventional down-conversion mixers are shown in Table 1 below. It is known from Table 1 that each conventional down-conversion mixer is unable to simultaneously achieve high conversion gain and low noise figure.

TABLE 1

|  | Down-Conversion Mixer by Ning Zhang | Down-Conversion Mixer by Yo-Sheng Lin |
| --- | --- | --- |
| frequency of radio frequency input (GHz) | 76 | 77 |
| frequency of intermediate frequency output (GHz) | 6 | 0.1 |
| conversion gain (dB) | −8 | 1.5 |
| noise figure (dB) | 17.8 | 23.3 |
| input third-order intercept point (dBm) | 2.5 | 2.7 |
| size (mm$^2$) | 0.42 | — |

SUMMARY

Therefore, an object of the disclosure is to provide a down-conversion mixer that can alleviate the drawback of the prior art.

According to the disclosure, the down-conversion mixer includes a transconductance unit, a resonant unit and a mixing unit. The transconductance unit is for receiving a differential input voltage signal pair, and converts the differential input voltage signal pair into a differential input current signal pair. The resonant unit is coupled to the transconductance unit for providing a negative resistance and a differential auxiliary current signal pair thereto. The mixing unit is for receiving a differential oscillatory voltage signal pair, and is coupled to the transconductance unit for receiving a combination of the differential input current signal pair and the differential auxiliary current signal pair therefrom. The mixing unit mixes the combination of the differential input current signal pair and the differential auxiliary current signal pair with the differential oscillatory voltage signal pair to generate a differential mixed voltage signal pair.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
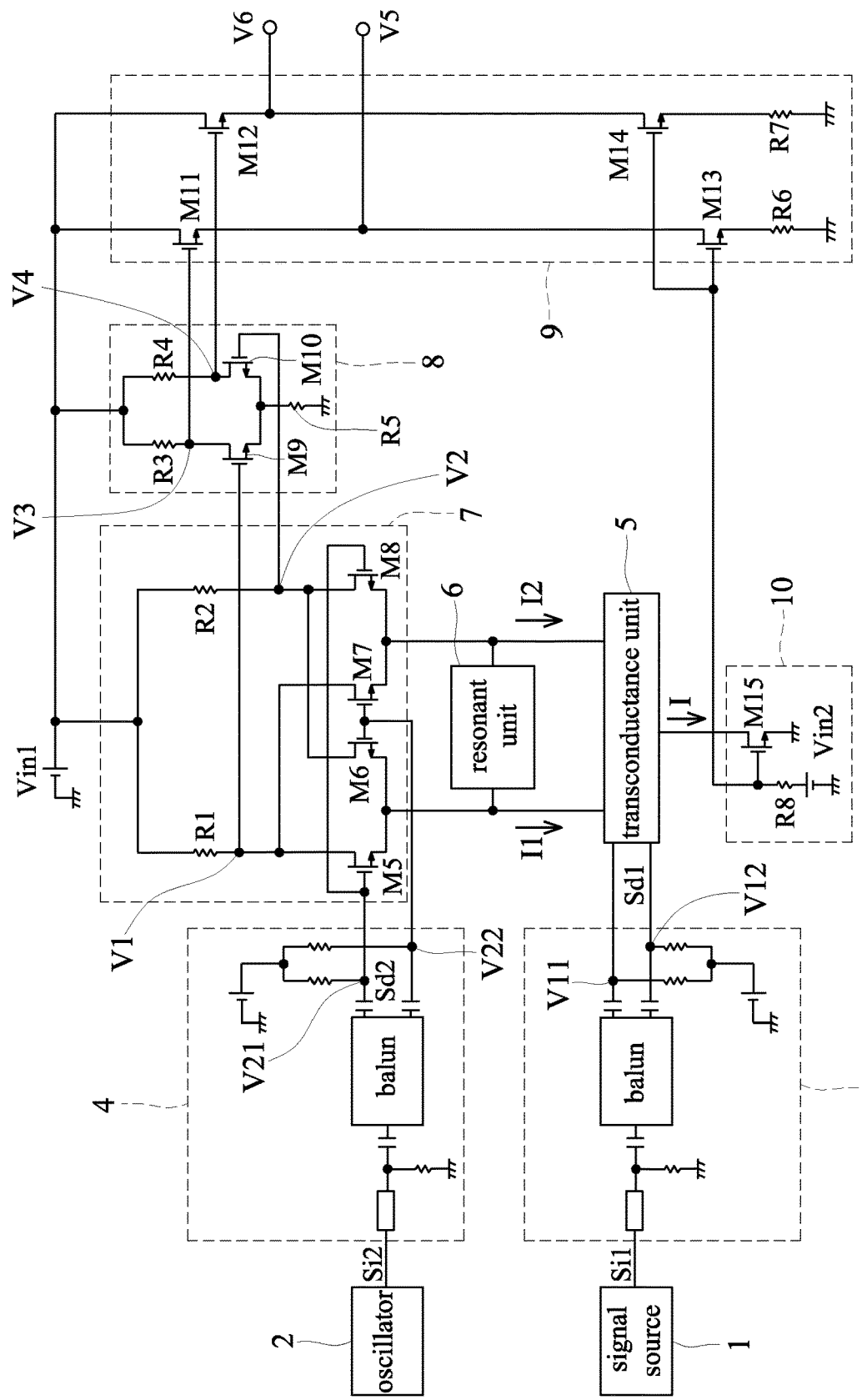
FIG. 1 is a circuit block diagram illustrating a first embodiment of a down-conversion mixer according to the disclosure.
Figure 2:
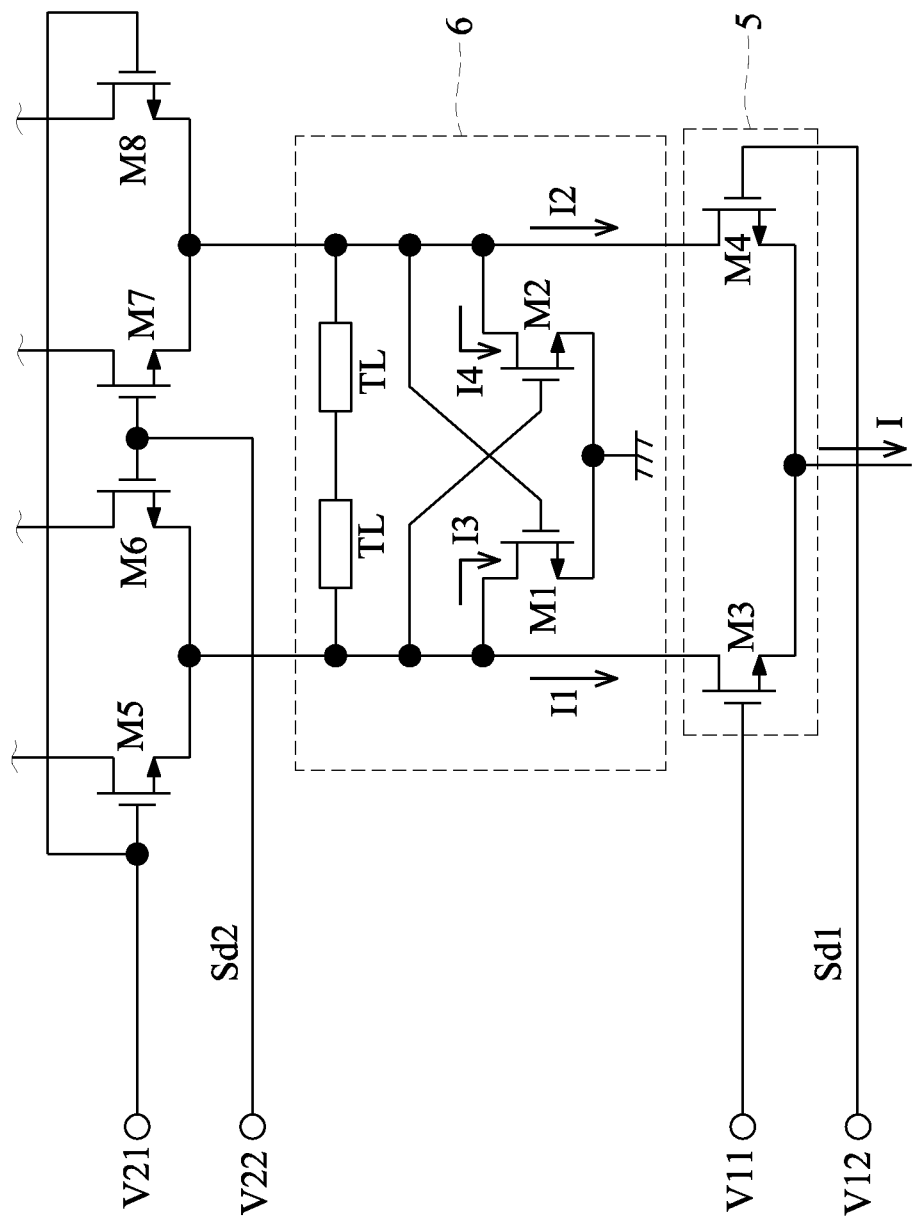
FIG. 2 is a circuit diagram illustrating a transconductance unit and a resonant unit of the first embodiment.

Referring to FIGS. 1 and 2, a first embodiment of a down-conversion mixer according to the disclosure is used to be coupled to a signal source 1 that generates a single-ended input voltage signal (Si1) of, for example, radio frequency, and an oscillator 2 that generates a single-ended oscillatory voltage signal (Si2). The down-conversion mixer of this embodiment includes a first single-ended to differential converting unit 3, a second single-ended to differential converting unit 4, a transconductance unit 5, a resonant unit 6, a mixing unit 7, an amplifying unit 8, a buffering unit 9 and a current source 10.

The first single-ended to differential converting unit 3 is used to be coupled to the signal source 1 for receiving the single-ended input voltage signal (Si1) therefrom, and converts the single-ended input voltage signal (Si1) into a differential input voltage signal pair (Sd1) that includes a first input voltage signal (V11) and a second input voltage signal (V12). FIG. 1 shows an exemplary implementation of the first single-ended to differential converting unit 3.

The second single-ended to differential converting unit 4 is used to be coupled to the oscillator 2 for receiving the single-ended oscillatory voltage signal (Si2) therefrom, and converts the single-ended oscillatory voltage signal (Si2) into a differential oscillatory voltage signal pair (Sd2) that includes a first oscillatory voltage signal (V21) and a second oscillatory voltage signal (V22). FIG. 1 shows an exemplary implementation of the second single-ended to differential converting unit 4.

The transconductance unit 5 is coupled to the first single-ended to differential converting unit 3 for receiving the differential input voltage signal pair (Sd1) therefrom, and converts the differential input voltage signal pair (Sd1) into a differential input current signal pair that includes a first input current signal (I1) and a second input current signal (I2).

The resonant unit 6 is coupled to the trans conductance unit 5 for providing thereto a negative resistance and a differential auxiliary current signal pair that includes a first auxiliary current signal (I3) and a second auxiliary current signal (I4).

The mixing unit 7 is coupled to the second single-ended to differential converting unit 4 for receiving the differential oscillatory voltage signal pair (Sd2) therefrom, and is coupled to the transconductance unit 5 for receiving a combination of the differential input current signal pair and the differential auxiliary current signal pair therefrom. The mixing unit 7 mixes the combination of the differential input current signal pair and the differential auxiliary current signal pair with the differential oscillatory voltage signal pair (Sd2) to generate a differential mixed voltage signal pair that includes a first mixed voltage signal (V1) and a second mixed voltage signal (V2) and that is of, for example, intermediate frequency.

The amplifying unit 8 is coupled to the mixing unit 7 for receiving the differential mixed voltage signal pair therefrom, and amplifies the differential mixed voltage signal pair to generate a differential amplified voltage signal pair that includes a first amplified voltage signal (V3) and a second amplified voltage signal (V4).

The buffering unit 9 is coupled to the amplifying unit 8 for receiving the differential amplified voltage signal pair therefrom, and buffers the differential amplified voltage signal pair to generate a differential buffered voltage signal pair that includes a first buffered voltage signal (V5) and a second buffered voltage signal (V6).

The current source 10 is coupled to the transconductance unit 5 for providing a bias current (I) thereto, and is coupled further to the buffering unit 9 for providing a bias voltage thereto.

In an example where the single-ended input voltage signal (Si1) has a frequency of 79 GHz, and where the single-ended oscillatory voltage signal (Si2) has a frequency of 78.9 GHz, the differential buffered voltage signal pair has a frequency of 0.1 GHz.

In this embodiment, the resonant circuit 6 is an LC-tank, and includes a first transistor (M1), a second transistor (M2) and two inductors (TL) as illustrated in FIG. 2. The first transistor (M1) has a first terminal that is coupled to the transconductance unit 5 and that provides the first auxiliary current signal (I3), a second terminal that is coupled to ground, and a control terminal. The second transistor (M2) has a first terminal that is coupled to the control terminal of the first transistor (M1) and the transconductance unit 5 and that provides the second auxiliary current signal (I4), a second terminal that is coupled to ground, and a control terminal that is coupled to the first terminal of the first transistor (M1). The cross-coupled first and second transistors (M1, M2) cooperatively provide the negative resistance. The inductors (TL) are coupled in series between the first terminals of the first and second transistors (M1, M2).

In this embodiment, as illustrated in FIG. 2, the transconductance unit 5 includes a third transistor (M3) and a fourth transistor (M4). The third transistor (M3) has a first terminal that is coupled to the first terminal of the first transistor (M1) and that provides the first input current signal (I1), a second terminal that is coupled to the current source 10 (see FIG. 1), and a control terminal that is coupled to the first single-ended to differential converting unit 3 for receiving the first input voltage signal (V11) therefrom. The fourth transistor (M4) has a first terminal that is coupled to the first terminal of the second transistor (M2) and that provides the second input current signal (I2), a second terminal that is coupled to the second terminal of the third transistor (M3), and a control terminal that is coupled to the first single-ended to differential converting unit 3 for receiving the second input voltage signal (V12) therefrom. The fourth transistor (M4) cooperates with the third transistor (M3) to receive the bias current (I) from the current source 10.

In this embodiment, the mixing unit 7 includes a fifth transistor (M5), a sixth transistor (M6), a seventh transistor (M7), an eighth transistor (M8), a first resistor (R1) and a second resistor (R2). The fifth transistor (M5) has a first terminal that provides the first mixed voltage signal (V1), a second terminal that is coupled to the first terminal of the third transistor (M3), and a control terminal that is coupled to the second single-ended to differential converting unit 4 for receiving the first oscillatory voltage signal (V21) therefrom. The sixth transistor (M6) has a first terminal that provides the second mixed voltage signal (V2), a second terminal that is coupled to the second terminal of the fifth transistor (M5), and a control terminal that is coupled to the second single-ended to differential converting unit 4 for receiving the second oscillatory voltage signal (V22) therefrom. The sixth transistor (M6) cooperates with the fifth transistor (M5) to receive a combination of the first input current signal (I1) and the first auxiliary current signal (I3). The seventh transistor (M7) has a first terminal that is coupled to the first terminal of the fifth transistor (M5), a second terminal that is coupled to the first terminal of the fourth transistor (M4), and a control terminal that is coupled to the control terminal of the sixth transistor (M6). The eighth transistor (M8) has a first terminal that is coupled to the first terminal of the sixth transistor (M6), a second terminal that is coupled to the second terminal of the seventh transistor (M7), and a control terminal that is coupled to the control terminal of the fifth transistor (M5). The eighth transistor (M8) cooperates with the seventh transistor (M7) to receive a combination of the second input current signal (I2) and the second auxiliary current signal (I4). The first resistor (R1) has a first terminal that receives a first supply voltage (Vin1), and a second terminal that is coupled to the first terminal of the fifth transistor (M5). The second resistor (R2) is coupled between the first terminal of the first resistor (R1) and the first terminal of the sixth transistor (M6).

In this embodiment, the amplifying unit 8 includes a ninth transistor (M9), a tenth transistor (M10), a third resistor (R3), a fourth resistor (R4) and a fifth resistor (R5). The ninth transistor (M9) has a first terminal that provides the first amplified voltage signal (V3), a second terminal, and a control terminal that is coupled to the first terminal of the fifth transistor (M5) for receiving the first mixed voltage signal (V1) therefrom. The tenth transistor (M10) has a first terminal that provides the second amplified voltage signal (V4), a second terminal that is coupled to the second terminal of the ninth transistor (M9), and a control terminal that is coupled to the first terminal of the sixth transistor (M6) for receiving the second mixed voltage signal (V2) therefrom. The third resistor (R3) has a first terminal that receives the first supply voltage (Vin1), and a second terminal that is coupled to the first terminal of the ninth transistor (M9). The fourth resistor (R4) is coupled between the first terminal of the third resistor (R3) and the first terminal of the tenth transistor (M10). The fifth resistor (R5) is coupled between the second terminal of the ninth transistor (M9) and ground.

In this embodiment, the buffering unit 9 includes an eleventh transistor (M11), a twelfth transistor (M12), a thirteenth transistor (M13), a fourteenth transistor (M14), a sixth resistor (R6) and a seventh resistor (R7). The eleventh transistor (M11) has a first terminal that receives the first supply voltage (Vin1), a second terminal that provides the first buffered voltage signal (V5), and a control terminal that is coupled to the first terminal of the ninth transistor (M9) for receiving the first amplified voltage signal (V3) therefrom. The twelfth transistor (M12) has a first terminal that is coupled to the first terminal of the eleventh transistor (M11), a second terminal that provides the second buffered voltage signal (V6), and a control terminal that is coupled to the first terminal of the tenth transistor (M10) for receiving the second amplified voltage signal (V4) therefrom. The thirteenth transistor (M13) has a first terminal that is coupled to the second terminal of the eleventh transistor (M11), a second terminal, and a control terminal that is coupled to the current source 10 for receiving the bias voltage therefrom. The fourteenth transistor (M14) has a first terminal that is coupled to the second terminal of the twelfth transistor (M12), a second terminal, and a control terminal that is coupled to the control terminal of the thirteenth transistor (M13). The sixth resistor (R6) is coupled between the second terminal of the thirteenth transistor (M13) and ground. The seventh resistor (R7) is coupled between the second terminal of the fourteenth transistor (M14) and ground.

In this embodiment, the current source 10 includes a fifteenth transistor (M15) and an eighth resistor (R8). The fifteenth transistor (M15) has a first terminal that is coupled to the second terminal of the third transistor (M3) and that provides the bias current (I), a second terminal that is coupled to ground, and a control terminal. The eighth resistor (R8) has a first terminal that receives a second supply voltage (Vin2), and a second terminal that is coupled to the control terminals of the thirteenth and fifteenth transistors (M13, M15) for providing the bias voltage thereto.

In this embodiment, each of the first to fifteenth transistors (M1-M15) is an N-type metal oxide semiconductor field effect transistor having a drain terminal, a source terminal and a gate terminal that respectively serve as the first, second and control terminals of the transistor. Moreover, each of the inductors (TL) is a transmission line inductor.

In this embodiment, the buffering unit 9 is configured in such a manner that an equivalent input impedance seen into the buffering unit 9 from the control terminals of the eleventh and twelfth transistors (M11, M12) is relatively high, and that an equivalent output impedance seen into the buffering unit 9 from the second terminals of the eleventh and twelfth transistors (M11, M12) is relatively low. As a result, loading effect can be reduced.

Further, resonance of the resonant unit 6 can compensate a frequency pole generated due to parasitic capacitances of the third to eighth transistors (M3-M8), so as to increase bandwidth of the down-conversion mixer.

Moreover, a conversion gain (cg) of the down-conversion mixer is a product of the following: (a) a ratio (r1) of a difference of the differential mixed voltage signal pair to a difference of the differential input voltage signal pair (Sd1); and (b) a voltage gain (r2) of the amplifying unit 8. The conversion gain (cg) can be expressed by the following equation:

$$cg = r1 \cdot r2 \approx \left( \frac{2}{\Pi} \cdot \frac{G_{m,LO}}{G_{m,LO} - g_{m1,2}} \cdot g_{m3,4} \cdot R_{1,2} \right) \cdot r2,$$

where $G_{m,LO}$ denotes an equivalent trans conductance seen into the mixing unit 7 from the second terminal of each of the fifth and seventh transistors (M5, M7), $g_{m1,2}$ denotes a trans conductance of each of the first and second transistors (M1, M2), $g_{m3,4}$ denotes a transconductance of each of the third and fourth transistors (M3, M4), and $R_{1,2}$ denotes a resistance of each of the first and second resistors (R1, R2). It is known from the equation that: (a) the negative resistance (i.e., $-2/g_{m1,2}$) provided by the cross-coupled first and second transistors (M1, M2) can increase a resistance seen at the first terminals of the third and fourth transistors (M3, M4), so as to boost the ratio (r1) and thus the conversion gain (cg); (b) the conversion gain (cg) increases with the increase of the transconductance ($g_{m1,2}$) when the transconductance ($g_{m1,2}$) is less than the equivalent transconductance ($G_{m,LO}$); and (c) the conversion gain (cg) increases with the increase of each of the trans conductance ($g_{m3,4}$) and the voltage gain (r2) of the amplifying unit 8.

Figure 3:
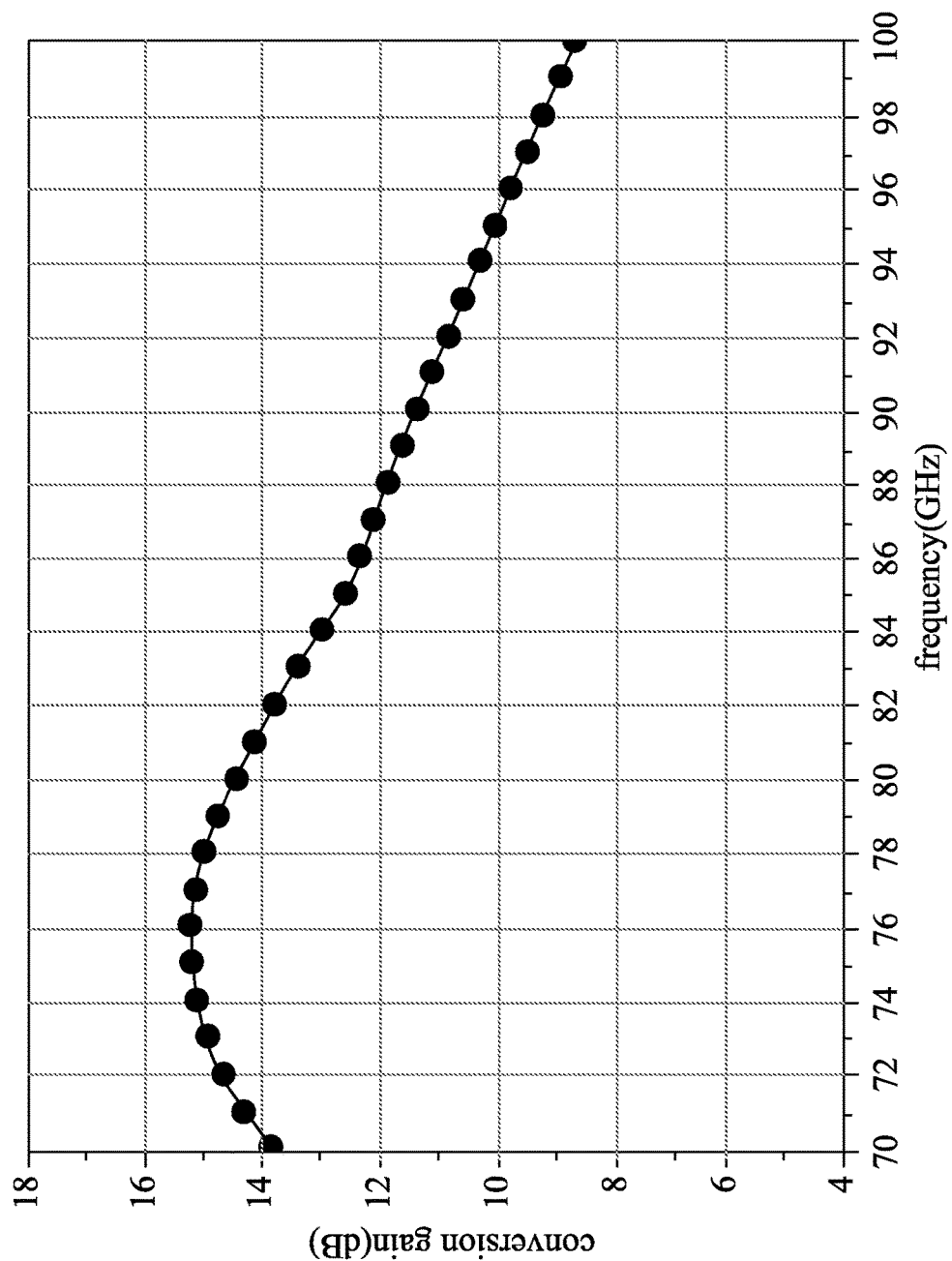
FIG. 3 is a plot illustrating conversion gain versus frequency characteristic of the first embodiment.

FIG. 3 illustrates the relationship between the conversion gain and the frequency of the single-ended input voltage signal (Si1) under a predetermined circumstance where the frequency of the single-ended input voltage signal (Si1) is within 70 GHz to 100 GHz, and where the frequency of the single-ended oscillatory voltage signal (Si2) is lower than that of the single-ended input voltage signal (Si1) by 0.1 GHz. It is known from FIG. 3 that the conversion gain is 14.7 dB when the frequency of the single-ended input voltage signal (Si1) is 79 GHz.

Figure 4:
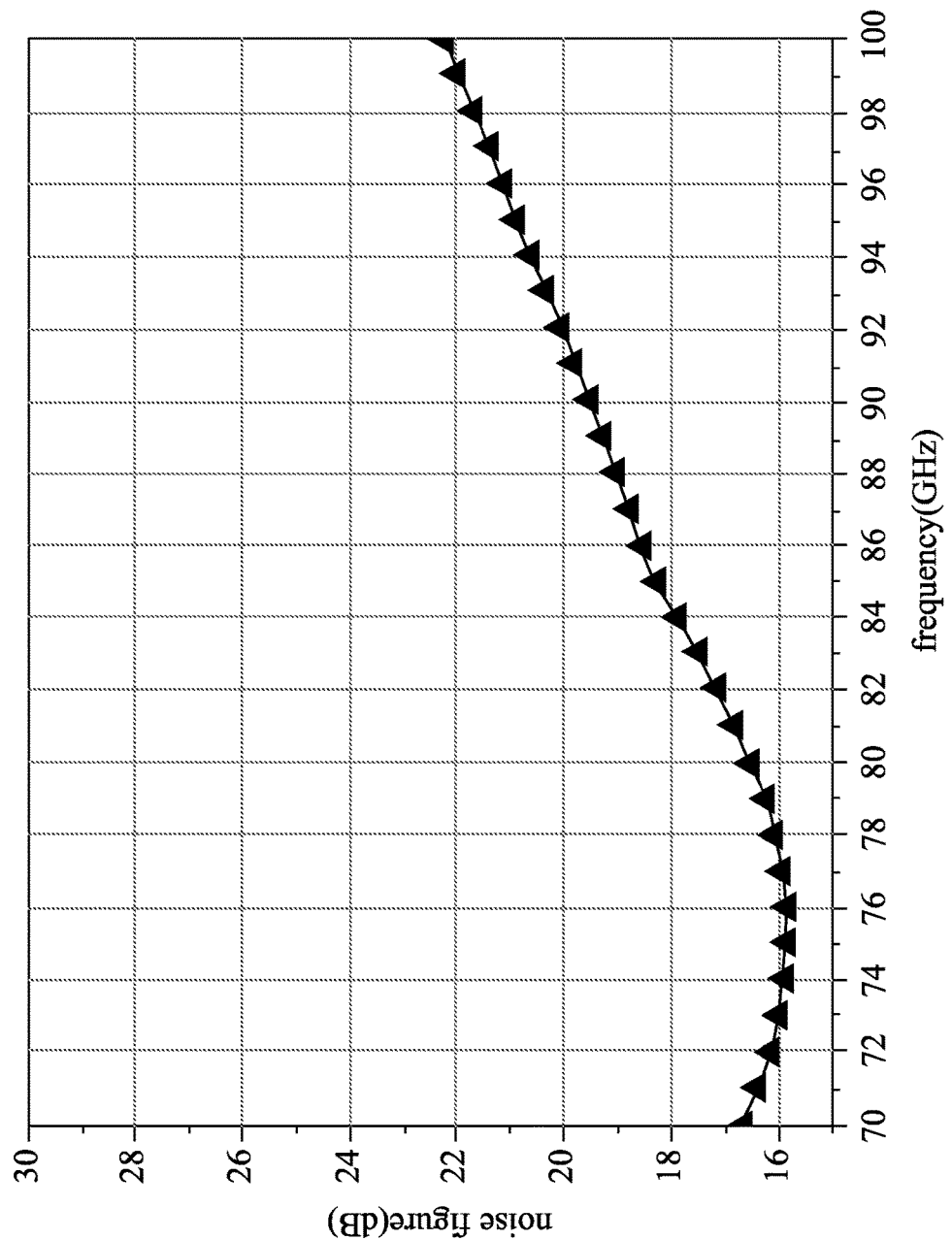
FIG. 4 is a plot illustrating noise figure versus frequency characteristic of the first embodiment.

FIG. 4 illustrates the relationship between a noise figure of the down-conversion mixer of the embodiment and the frequency of the single-ended input voltage signal (Si1) under the predetermined circumstance. It is known from FIG. 4 that the noise figure is 16.3 dB when the frequency of the single-ended input voltage signal (Si1) is 79 GHz.

Figure 5:
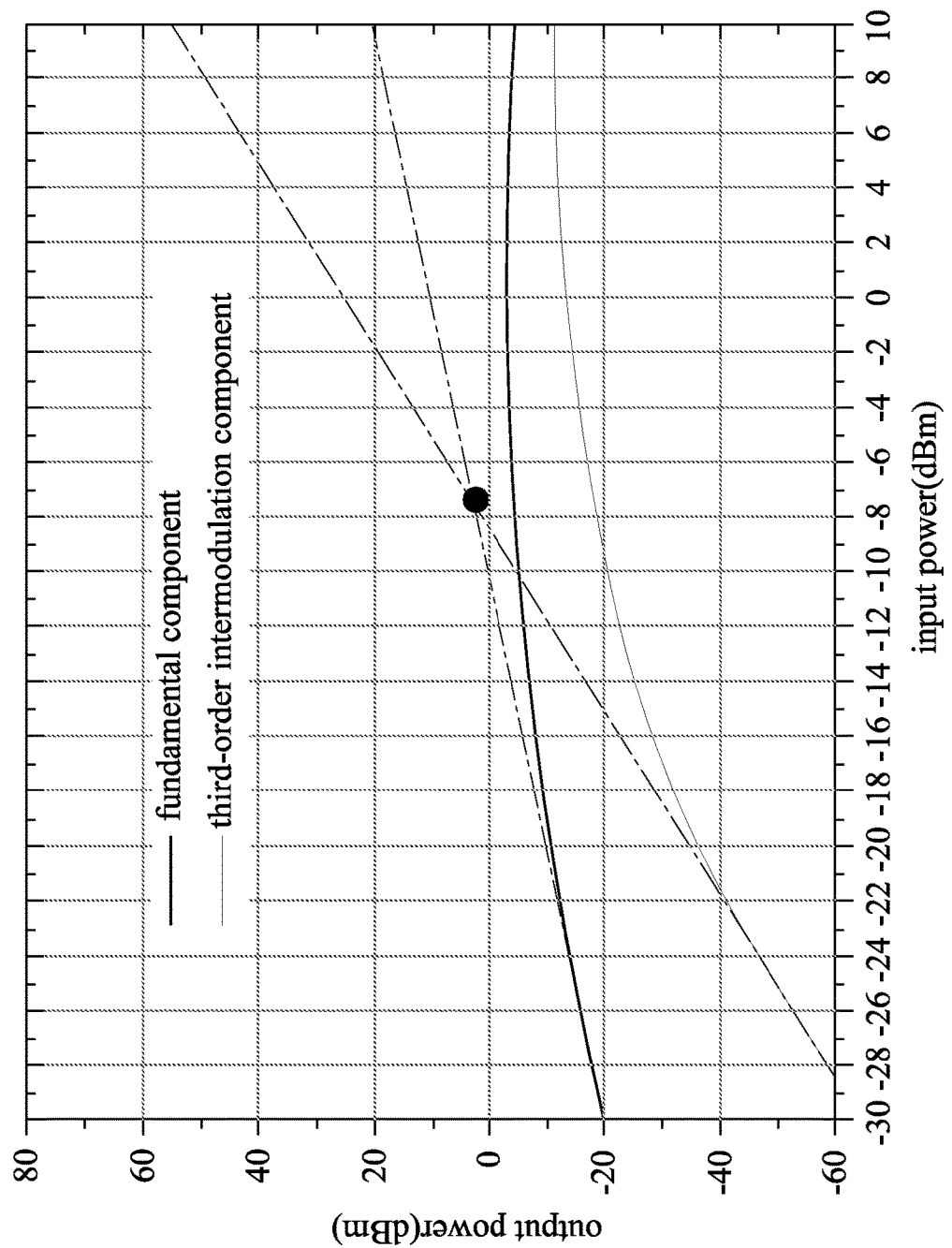
FIG. 5 is a plot illustrating output power versus input power characteristic of the first embodiment.

FIG. 5 illustrates output power versus input power characteristic of the down-conversion mixer of the embodiment under a circumstance where the frequency of the single-ended input voltage signal (Si1) is 79 GHz, and where the frequency of the single-ended oscillatory voltage signal (Si2) is 78.9 GHz. It is known from FIG. 5 that an input third-order intercept point of the down-conversion mixer is −7 dBm when the frequency of the single-ended input voltage signal (Si1) is 79 GHz.

In view of the above, the down-conversion mixer of this embodiment can simultaneously achieve high conversion gain and low noise figure.

Figure 6:
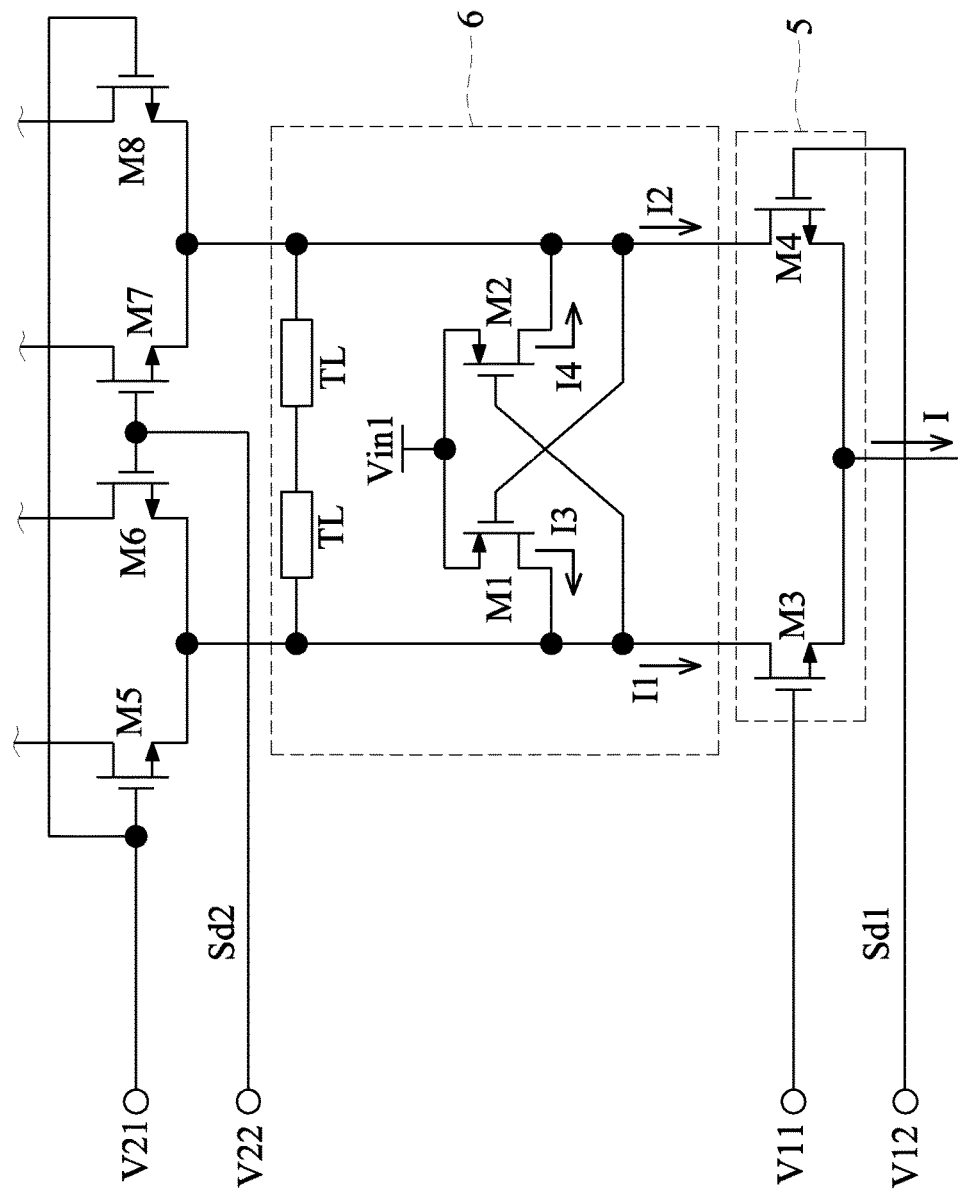
FIG. 6 is a circuit diagram illustrating the transconductance unit and the resonant unit of a second embodiment of the down-conversion mixer according to the disclosure.

Referring to FIG. 6, a second embodiment of the down-conversion mixer according to the disclosure is a modification of the first embodiment, which differs from the first embodiment in that: (a) the second terminal of each of the first and second transistors (M1, M2) receives the first supply voltage (Vin1), instead of being coupled to ground; and (b) each of the first and second transistors (M1, M2) is a P-type metal oxide semiconductor field effect transistor having a drain terminal, a source terminal and a gate terminal that respectively serve as the first, second and control terminals of the transistor.

In the second embodiment, the first and second auxiliary current signals (I3, I4) are not supplied through the first and second resistors (R1, R2) (see FIG. 1), and therefore the down-conversion mixer of this embodiment has relatively low power consumption as compared to that of the first embodiment.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A down-conversion mixer comprising:
    a transconductance unit for receiving a differential input voltage signal pair, and converting the differential input voltage signal pair into a differential input current signal pair;
    a resonant unit coupled to said transconductance unit for providing a negative resistance and a differential auxiliary current signal pair thereto; and
    a mixing unit for receiving a differential oscillatory voltage signal pair, and coupled to said transconductance unit for receiving a combination of the differential input current signal pair and the differential auxiliary current signal pair therefrom, said mixing unit mixing the combination of the differential input current signal pair and the differential auxiliary current signal pair with the differential oscillatory voltage signal pair to generate a differential mixed voltage signal pair;
    wherein the differential auxiliary current signal pair includes a first auxiliary current signal and a second auxiliary current signal, and said resonant unit includes:
    a first transistor having a first terminal that is coupled to said transconductance unit and that provides the first auxiliary current signal, a second terminal that is coupled to ground, and a control terminal;
    a second transistor having a first terminal that is coupled to said control terminal of said first transistor and said transconductance unit and that provides the second auxiliary current signal, a second terminal that is coupled to ground, and a control terminal that is coupled to said first terminal of said first transistor; and
    two inductors coupled in series between said first terminals of said first and second transistors.

2. The down-conversion mixer of claim 1, wherein the differential input voltage signal pair includes a first input voltage signal and a second input voltage signal, the differential input current signal pair includes a first input current signal and a second input current signal, and said transconductance unit includes:
    a third transistor having a first terminal that is coupled to said first terminal of said first transistor and that provides the first input current signal, a second terminal, and a control terminal that receives the first input voltage signal; and
    a fourth transistor having a first terminal that is coupled to said first terminal of said second transistor and that provides the second input current signal, a second terminal that is coupled to said second terminal of said third transistor, and a control terminal that receives the second input voltage signal.

3. The down-conversion mixer of claim 2, wherein the differential oscillatory voltage signal pair includes a first oscillatory voltage signal and a second oscillatory voltage signal, the differential mixed voltage signal pair includes a first mixed voltage signal and a second mixed voltage signal, and said mixing unit includes:
    a fifth transistor having a first terminal that provides the first mixed voltage signal, a second terminal that is coupled to said first terminal of said third transistor, and a control terminal that receives the first oscillatory voltage signal;
    a sixth transistor having a first terminal that provides the second mixed voltage signal, a second terminal that is coupled to said second terminal of said fifth transistor, and a control terminal that receives the second oscillatory voltage signal, said sixth transistor cooperating with said fifth transistor to receive a combination of the first input current signal and the first auxiliary current signal;
    a seventh transistor having a first terminal that is coupled to said first terminal of said fifth transistor, a second terminal that is coupled to said first terminal of said fourth transistor, and a control terminal that is coupled to said control terminal of said sixth transistor;
    an eighth transistor having a first terminal that is coupled to said first terminal of said sixth transistor, a second terminal that is coupled to said second terminal of said seventh transistor, and a control terminal that is coupled to said control terminal of said fifth transistor, said eighth transistor cooperating with said seventh transistor to receive a combination of the second input current signal and the second auxiliary current signal;
    a first resistor having a first terminal that receives a supply voltage, and a second terminal that is coupled to said first terminal of said fifth transistor; and
    a second resistor coupled between said first terminal of said first resistor and said first terminal of said sixth transistor.

4. The down-conversion mixer of claim 1, further comprising an amplifying unit that is coupled to said mixing unit for receiving the differential mixed voltage signal pair therefrom, and that amplifies the differential mixed voltage signal pair to generate a differential amplified voltage signal pair.

5. The down-conversion mixer of claim 4, wherein the differential mixed voltage signal pair includes a first mixed voltage signal and a second mixed voltage signal, the differential amplified voltage signal pair includes a first amplified voltage signal and a second amplified voltage signal, and said amplifying unit includes:
    a first transistor having a first terminal that provides the first amplified voltage signal, a second terminal, and a control terminal that is coupled to said mixing unit for receiving the first mixed voltage signal therefrom;
    a second transistor having a first terminal that provides the second amplified voltage signal, a second terminal that is coupled to said second terminal of said first transistor, and a control terminal that is coupled to said mixing unit for receiving the second mixed voltage signal therefrom;
a first resistor having a first terminal that receives a supply voltage, and a second terminal that is coupled to said first terminal of said first transistor;
a second resistor coupled between said first terminal of said first resistor and said first terminal of said second transistor; and
a third resistor coupled between said second terminal of said first transistor and ground.

6. The down-conversion mixer of claim 4, further comprising a buffering unit that is coupled to said amplifying unit for receiving the differential amplified voltage signal pair therefrom, and that buffers the differential amplified voltage signal pair to generate a differential buffered voltage signal pair.

7. The down-conversion mixer of claim 6, wherein the differential amplified voltage signal pair includes a first amplified voltage signal and a second amplified voltage signal, the differential buffered voltage signal pair includes a first buffered voltage signal and a second buffered voltage signal, and said buffering unit includes:
a first transistor having a first terminal that receives a supply voltage, a second terminal that provides the first buffered voltage signal, and a control terminal that is coupled to said amplifying unit for receiving the first amplified voltage signal therefrom;
a second transistor having a first terminal that is coupled to said first terminal of said first transistor, a second terminal that provides the second buffered voltage signal, and a control terminal that is coupled to said amplifying unit for receiving the second amplified voltage signal therefrom;
a third transistor having a first terminal that is coupled to said second terminal of said first transistor, a second terminal, and a control terminal that receives a bias voltage;
a fourth transistor having a first terminal that is coupled to said second terminal of said second transistor, a second terminal, and a control terminal that is coupled to control terminal of said third transistor;
a first resistor coupled between said second terminal of said third transistor and ground; and
a second resistor coupled between said second terminal of said fourth transistor and ground.

8. The down-conversion mixer of claim 1, further comprising a single-ended to differential converting unit that is coupled to said transconductance unit, that receives a single-ended input voltage signal, and that converts the single-ended input voltage signal into the differential input voltage signal pair for said transconductance unit.

9. The down-conversion mixer of claim 1, further comprising a single-ended to differential converting unit that is coupled to said mixing unit, that receives a single-ended oscillatory voltage signal, and that converts the single-ended oscillatory voltage signal into the differential oscillatory voltage signal pair for said mixing unit.

10. A down-conversion mixer comprising:
a transconductance unit for receiving a differential input voltage signal pair, and converting the differential input voltage signal pair into a differential input current signal pair;
a resonant unit coupled to said transconductance unit for providing a negative resistance and a differential auxiliary current signal pair thereto; and
a mixing unit for receiving a differential oscillator voltage signal pair, and coupled to said transconductance unit for receiving a combination of the differential input current signal pair and the differential auxiliary current signal pair therefrom, said mixing unit mixing the combination of the differential input current signal pair and the differential auxiliary current signal pair with the differential oscillatory voltage signal pair to generate a differential mixed voltage signal pair;
wherein the differential auxiliary current signal pair includes a first auxiliary current signal and a second auxiliary current signal, and said resonant unit includes:
a first transistor having a first terminal that is coupled to said transconductance unit and that provides the first auxiliary current signal, a second terminal that receives a supply voltage, and a control terminal;
a second transistor having a first terminal that is coupled to said control terminal of said first transistor and said transconductance unit and that provides the second auxiliary current signal, a second terminal that receives the supply voltage, and a control terminal that is coupled to said first terminal of said first transistor; and
two inductors coupled in series between said first terminals of said first and second transistors.

* * * * *